United States Patent
Lin et al.

(10) Patent No.: US 6,427,186 B1
(45) Date of Patent: Jul. 30, 2002

(54) MEMORY, INTERFACE SYSTEM AND METHOD FOR MAPPING LOGICAL BLOCK NUMBERS TO PHYSICAL SECTOR NUMBERS IN A FLASH MEMORY, USING A MASTER INDEX TABLE AND A TABLE OF PHYSICAL SECTOR NUMBERS

(76) Inventors: Frank (Fong-Long) Lin, 2201 Pinard St., Milpitas, CA (US) 95035; Dongsheng Xing, 41443 Timber Creek Ter., Fremont, CA (US) 94539

( * ) Notice: Subject to any disclaimer, the term of this patent is extended or adjusted under 35 U.S.C. 154(b) by 0 days.

(21) Appl. No.: 09/281,630

(22) Filed: Mar. 30, 1999

(51) Int. Cl.[7] .................. G06F 12/10; G06F 11/20; G06F 13/00
(52) U.S. Cl. .................. 711/103; 711/202; 711/206; 714/8
(58) Field of Search .............. 711/103, 5, 202, 711/209, 203, 205, 206, 207; 714/5, 6, 7, 8

(56) References Cited

U.S. PATENT DOCUMENTS

| | | | | |
|---|---|---|---|---|
| 5,432,748 A | * | 7/1995 | Hsu et al. ............... | 365/230.01 |
| 5,526,335 A | * | 6/1996 | Tamegai ................. | 369/58 |
| 5,630,093 A | * | 5/1997 | Holzhammer et al. ....... | 711/115 |
| 5,742,934 A | * | 4/1998 | Shinohara ............... | 711/103 |
| 5,875,477 A | * | 2/1999 | Hasbun et al. ............ | 711/103 |
| 5,905,993 A | * | 5/1999 | Shinohara ............... | 711/103 |
| 5,933,852 A | * | 8/1999 | Jeddeloh ................ | 711/204 |
| 5,946,714 A | * | 8/1999 | Miyauchi ................ | 711/205 |
| 6,016,275 A | * | 1/2000 | Han ..................... | 365/185.29 |
| 6,069,827 A | * | 5/2000 | Sinclair ................. | 365/185.29 |
| 6,081,878 A | * | 6/2000 | Estakhri et al. ........... | 711/103 |

* cited by examiner

Primary Examiner—Glenn Gossage
(74) Attorney, Agent, or Firm—Gray Cary Ware & Freidenrich LLP

(57) ABSTRACT

A memory system, an interface system for accessing a physical sector on an electrically erasable media based upon a logical block number, and a method for mapping a logical block number to a physical sector on an electrically erasable media are disclosed. The erasable media has an erase block size larger than a write block size. The interface system interfaces a host processor to an electrically-erasable memory, such as a flash media. The host processor requests access to the memory based on a logical block number. The interface system uses a first portion of the logical block number to determine from a master index table a physical sector number of a table of physical sector numbers corresponding to the logical block number. The interface system uses a second portion of the logical block number to determine from the table of physical sector numbers the physical sector number on the media corresponding to the logical block number. The host processor is provided access to the physical sector having the physical sector number corresponding to the logical block number. A logical block number may be remapped to a physical sector that has been completely erased by updating the table of physical sector numbers corresponding to the logical block number. A plurality of physical sectors, which are marked as discarded are erased simultaneously.

10 Claims, 3 Drawing Sheets

PAGE FORMAT 1

PAGE FORMAT 2

FIG. 4

| 402 DATA | 404 ECC | 406 AGE COUNT | 408 SEG. DETECT MAP | 410 LBN | 412 CHECK SUM | 414 STATE |
|---|---|---|---|---|---|---|
| 512 | 8 | 3 | 1 | 2 | 1 | 1 |

| SECTOR INDEX | SDM | ... | SECTOR VALID | DEFECT |
|---|---|---|---|---|
| 0 | DBH | | FH | GOOD |
| 1 | | | | GOOD |
| 2 | | | | BAD |
| 3 | | | | GOOD |
| 4 | | | | BAD |
| 5 | | | | GOOD |
| 6 | | | | GOOD |
| 7 | | | | GOOD |

(A) SECTOR LEVEL DETECT
MGMT TABLE FOR SEGMENTS WITH 8 SECTORS

FIG. 5B

| SECTOR INDEX | SDM | ... | SECTOR VALID | DEFECT |
|---|---|---|---|---|
| 00-01 | XXH | | NH | BAD |
| 02-03 | XXH | | NH | BAD |
| 04-05 | A0H | | FH | GOOD |
| 06-07 | | | | GOOD |
| 08-09 | | | | BAD |
| 10-11 | | | | GOOD |
| 12-13 | | | | BAD |
| 14-15 | | | | GOOD |

'X'—ANY VALUE, 'N'—ANY VALUE EXCEPT 'F'
(B) SECTOR LEVEL DETECT
MGMT TABLE FOR SEGMENTS WITH 16 SECTORS

MEMORY, INTERFACE SYSTEM AND METHOD FOR MAPPING LOGICAL BLOCK NUMBERS TO PHYSICAL SECTOR NUMBERS IN A FLASH MEMORY, USING A MASTER INDEX TABLE AND A TABLE OF PHYSICAL SECTOR NUMBERS

TECHNICAL FIELD

The present invention relates to defect management in flash memory devices and, in particular, to an interface controller to such a memory that includes circuitry to reliably track, and prohibit access to, defective sectors.

BACKGROUND

The use of electrically erasable memory is well-known in the art. For example, standards for "flash" memory and circuits for controlling access to the flash memory have been defined by the Personal Computer Memory Card International Association (PCMCIA) and Compact Flash Association (CFA). PCMCIA-compliant cards have been used with portable computers as an adjunct to (or instead of) a hard drive and, more recently, for such devices as digital cameras.

Where an electrically erasable memory can be programmed in one size "chunk", but can only be erased in another (larger) size "chunk", complexity is introduced into the programming operation. For example, with one particular flash memory media, the media can be programmed sector by sector, but can only be erased in segments (which are multiple sectors). Furthermore, where there are manufacturing defects in the memory, which is quite common, this conventionally requires a large amount of overhead to efficiently avoid the defects without also having to disregard a large portion of non-defective memory.

SUMMARY

An interface system interfaces a host processor to an electrically-erasable memory in a memory space, such as a flash media. The memory space defines a plurality of segments. A media interface circuit regulates access by the host processor to the electrically-erasable memory in the memory space. The host processor requests access to the memory based on a logical block number.

The interface system includes:
means for using the logical block number to determine from a master index table a physical sector number of a table of physical sector numbers corresponding to the logical block number; and
means for using the logical block number to determine from the table of physical sector numbers the physical sector number on the media corresponding to the logical block number.

With such a system, the memory can be efficiently remapped to address both manufacturing defects and programming considerations.

BRIEF DESCRIPTION OF FIGURES

FIG. 4 illustrates the sector format in greater detail.

FIG. 5A illustrates a first example of a sector-level defect management table, for flash media whose segments have 8 sectors each; and FIG. 5B illustrates a second example of a sector-level defect management table, for flash media whose segments have 16 sectors each.

FIG. 7 illustrates a free list table 700; FIG. 8 illustrates an erasable and relaxation table 800; and FIG. 9 illustrates a transfer table 900.

DETAILED DESCRIPTION

Figure 1:
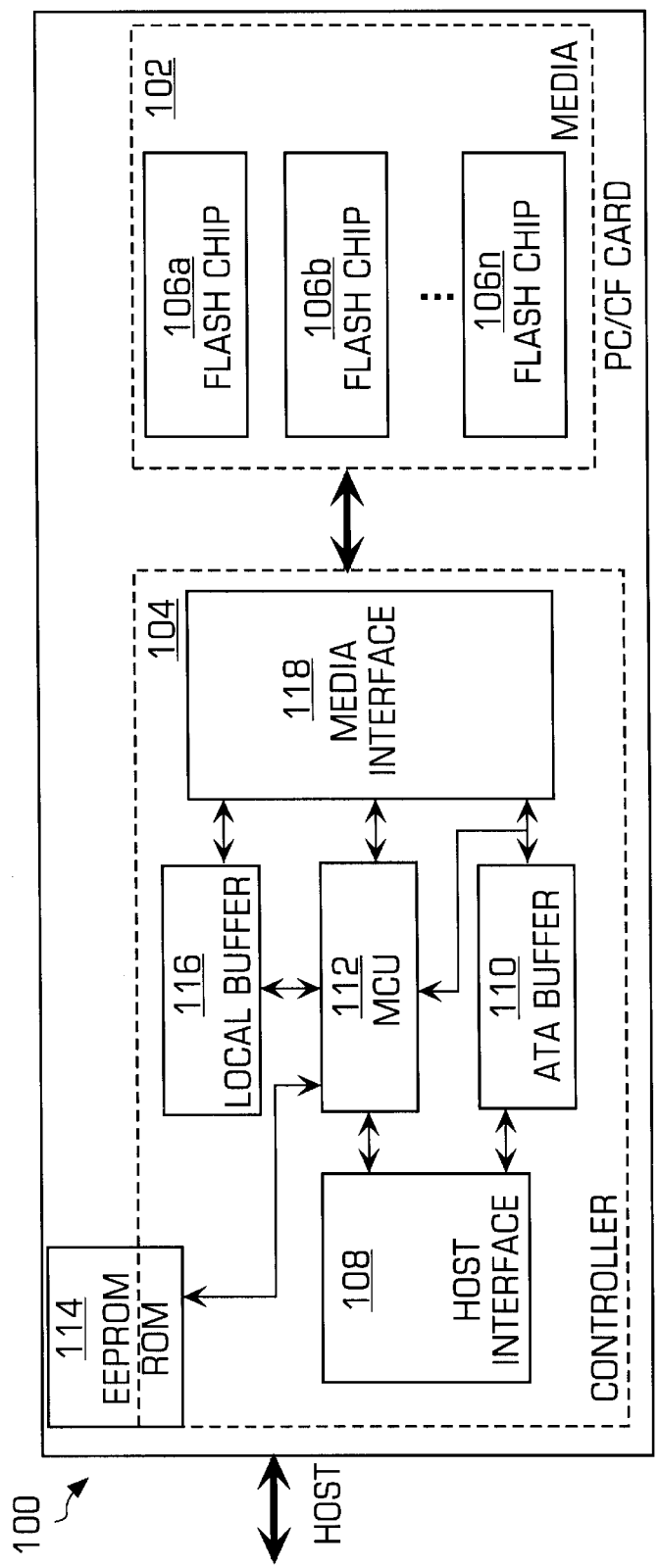
FIG. 1 is a block diagram of a circuit card having flash media, and embodying a system for managing defects within segments of the flash media.

FIG. 1 schematically illustrates a PC/CF (meaning either PCMCIA or Compact Flash) circuit card 100 having flash memory media 102 and a controller 104 for controlling access to the media 102. In the particular PC/CF circuit card 100 shown in FIG. 1, the media 102 includes a number of flash memory chips 106a through 106n which are, for example, available from Silicon Storage Technology, Inc. of Sunnyvale, Calif. Each memory chip 106a through 106n may be, for example, 64 megabits (or 8 megabytes (8 MB)) or 16 megabits (2 megabytes or 2 MB).

The memory cells of the flash memory chips 106a through 106n are grouped into segments (sometimes called blocks), where segments are the base unit for the erase operation, meaning that all the memory cells in a particular segment must be erased at the same time. A segment generally includes several sectors, typically 16 or 32.

Figure 2:
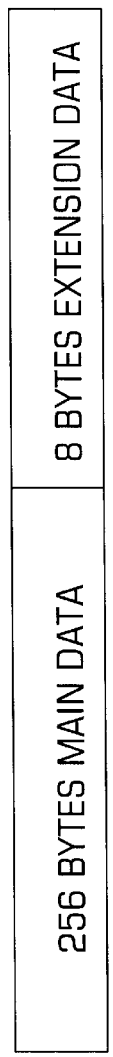
FIG. 2 illustrates a first page format on the flash media of the FIG. 1 circuit card.
Figure 3:
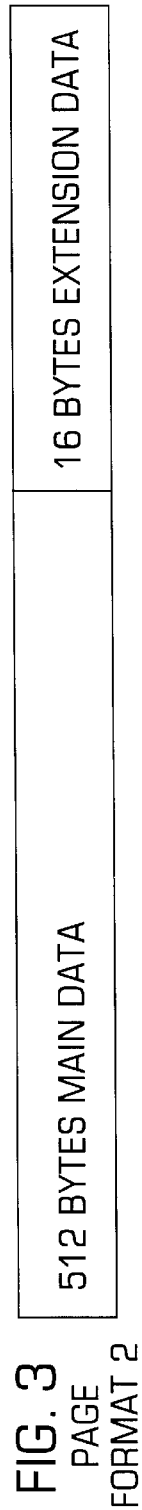
FIG. 3 illustrates a second page format on the flash media of the FIG. 1 circuit card.

In the described embodiment, the main data section of each page has 256 (format 1) or 512 bytes (format 2), and the extension data section has 8 or 16 bytes. Each "sector" typically includes 512 user data bytes. Therefore two format 1 pages make up one sector, while one format 2 page also corresponds to one sector. Format 1 is shown in FIG. 2, while format 2 is shown in FIG. 3. The extension data (discussed in more detail later, with reference to FIG. 4) is used for error correction coding (ECC) (8 bytes) and for bookkeeping control information (8 bytes). The main data section and the extension data section can be read and programmed (i.e., written) independently of each other, although only reading/writing of housekeeping control information may be done without reading/writing main data and not vice versa. The main data section may also instead be used for holding bookkeeping control information, called XPAGE, which is discussed later.

In the described embodiment, the controller 104 is an intelligent Integrated Drive Electronics (IDE)/Advanced Technology Attachment (ATA) or IDE/ATA controller dedicated to the PC/CF 100. In the preferred embodiment, the controller 104 may be SST55LD016 from Silicon Storage Technology, Inc. The controller 104 includes a host interface 108 (that complies with the PCMCIA ATA and CF interface standards) and a media interface 118 (for sending commands to the media 102 and for interfacing to the media 102 for the purpose of reading and/or writing of data). An ATA buffer 110 is used to buffer data between the host (for example, a notebook computer) and the media 102. When the host writes data to the card 100, the data is buffered in the ATA buffer 110. Then, the microcontroller unit (MCU) 112, under control of firmware in an off or on chip Electrically Erasable Programmable Read Only Memory {EEPROM) 114, finds free sectors in the chips 106a through 106n of the media 102 in which to store the data. (In one embodiment, the finding of free sectors is carried out in a "wear levelling" manner discussed in greater detail later, with reference to FIGS. 7 to 9.) Alternately, when the host reads data from the card 100, the microcontroller 112 (under control of the firmware) finds the data and reads the data from the media 102 into the ATA buffer 110. Then, the microcontroller 112 informs the host to read the data from the ATA buffer 110.

In one embodiment, the ATA buffer 110 is 8 sectors in size. As discussed above in one embodiment, each sector has 512 bytes user data and 16 byes of control data. Thus, in this embodiment, the ATA buffer 110 is (512+16)*8 bytes. A local buffer 116 is also provided, but the local buffer 116 can only be accessed by the microcontroller 112 and the media interface 118. The local buffer 116 serves as the variable and stack space of the microcontroller 112 executing the firmware stored in the EEPROM 114, and can also be used for storing bookkeeping information. In one embodiment, the ATA buffer 110 and the local buffer 116 are dual-ported, and both ports can be accessed at the same time.

FIG. 4 illustrates the sector format, but in greater detail. As discussed above, the sector 400 in this format has 512 data bytes and 16 control bytes. As also discussed above, the sector 400 may include one or two pages of flash memory, depending on the page size of a particular media 102. In the described embodiment, there are no spare bytes allocated in the sector 400 for defect replacement, although such spare bytes could certainly be provided. It should be noted that, typically, read and program operations are performed on a sector basis (as opposed to erase operations, which are performed on a segment basis).

The specific parts of the sector 400 are now discussed. The data part 402 has space to store 512 bytes of data. The data stored in the data part 402 is usually user data, although if this sector is holding the bookkeeping information discussed briefly above called "XPAGE", the data stored in the data part are physical sector numbers, or "PSN's".

The Error Correction Code (ECC) part 404 holds an error correction code that is used to determine the integrity of the 512 bytes of data in the data portion 402. Eight bytes are allocated for holding the ECC. When data is written to the media 102 by direct memory access (DMA), the ECC is calculated by hardware in the media interface 118 without firmware, stored in the EEPROM 114, intervention. The microcontroller 112 may disable ECC generation and/or checking when writing to or reading from the media 102.

The STATE field 414 indicates the current status of a particular sector 400. Upon power up of the card 100 (which typically occurs upon power up of the system that provides power to the card) or after other types of "reset", the microcontroller 112 uses the information in the STATE field 414 to put the card 100 into an operational state. In one embodiment, as a double check of the integrity of the STATE field 414 information, the upper nibble and lower nibble of the STATE field 414 are made to be redundant. The STATE field 414 information may be one of:

ERASED After a sector is successfully erased, the STATE field 414 for the sector is changed to FFh to indicate that the sector is available to be programmed with new data.

USER DATA A 55h in the STATE field 414 indicates that the sector has valid user data in the USER DATA field 402.

XPAGE An AAh in the STATE field 414 indicates that the USER DATA field 402 contains 256 entries of 2-byte Physical Sector Numbers (PSN's). The XPAGE feature is discussed in more detail later.

DISCARD A to-be discarded XPAGE is marked as 88h in the STATE field 414, while a to-be discarded user data sector is marked as 00h in the STATE field 414. Such a marking indicates that the content of the sector 400 so marked is ready for erasure. A particular usefulness of this feature is discussed later, with reference to the Master Index Table (MIT) 606 shown in FIG. 6.

The LBN field 410 indicates the logical block number for the sector 400 if the sector 400 has user data in the USER DATA field 402, or the XPAGE number (index into MIT) for the sector 400 if the sector 400 has XPAGE data in the USER DATA field 402.

The CHECKSUM field 412 is divided into two parts: the high nibble is a flag for a SECTOR VALID indication, and the low nibble is a checksum of LBN. If the high nibble (SECTOR VALID) is Fh, the AGE COUNT field 406 (discussed immediately below) is valid. Otherwise, the AGE COUNT field 406 is invalid. The low nibble is calculated as follows:

LBN[15:12] XOR LBN[11:8] XOR LBN[7:4] XOR LBN [3:0]. Checksum calculation and verification is performed by the microcontroller 112 under the control of the firmware stored in the EEPROM 114.

As discussed above, the two bytes of LBN is the logical block number for user data sectors and the XPAGE number (index into MIT) for XPAGE sectors. At power-up, the MIT 606 is built based on the LBN field. Thus, if an XPAGE is corrupted (for example, due to an ECC error) or lost (for example, an XPAGE is not recorded on the media 102 from the cache before power off), the LBN field is used to build XPAGE. The maximum logical block number depends on the number of bits reserved for the LBN field.

In the case of an ECC error, the XPAGE is built when the ECC error occurs. In the case of the XPAGE not being recorded before power off, the XPAGE is built at the next power on, and this build is very time consuming. In the worst case, the card is searched sector by sector (or segment by segment) for user data sectors by reading control information: The XPAGE build may also serve as garbage collection. If two sectors are found with the same LBN, they are verified by reading the data. The good one is chosen (no ECC error) and the other one is discarded. This may happen if a power-down occurs after new sectors are programmed but before the old sector is discarded.

In one embodiment, to build XPAGE, the entry point is XpageBuild. The number of XPAGES that can be built at one time is limited by the size of the cache buffer.

The AGE COUNT field 406 is used to track the number of program-erase cycles. This information is used for the purpose of wear levelling. The AGE COUNT field 406 has a three byte counter which has a maximum count of over 16 million. The AGE COUNT field 406 is implemented on a segment basis, since the entire segment is erased at one time. Therefore, there is only one AGE COUNT for the segment, and it is stored in a non-defective sector (in one embodiment, the first non-defective sector of the segment).

The SDM field 408 is used to hold a segment defect map, which is a one-byte bit map of the sectors within a segment. In one embodiment, where there are less than eight sectors per segment, the mapping is one sector per bit. In another embodiment, the mapping is more than one sector per bit. For example, if there are 16 sectors per segment, then the mapping is two sectors per bit. If a bit of the SDM field 408 is "1", then the corresponding sectors are not defective. By contrast, if a bit of the SDM field 408 is "0", then at least one corresponding sector is defective and should not be relied upon for storing data. As with the AGE COUNT field 406, the SDM field 408 is implemented on a segment basis and, therefore, there is only one SDM field 408 per segment (like the AGE COUNT field 406, in one embodiment, stored in the first non-defective sector). When a program failure in a particular sector occurs, the SDM field 408 is updated to indicate the newly-defective sector.

Now, defect management is discussed in greater detail. In general, memory cells of the media 102 may be defective as a result of either a manufacturing defect or as a result of simply wearing out. Those memory cells which are defective (based on an objective standard, such as that set forth by the manufacturer) are marked as defective by the manufacturer. For example, for certain flash memory chips, the defects are marked on a segment basis where, during production, only those segments that are consistently read as all "1" are considered to be free of manufacturing defect.

Then, in operation, after certain erase-program cycles, more defective memory cells may result. An erase failure is indicated, for example, by a memory cell that cannot be charged enough to represent a "1". As a result, the whole segment is deemed unusable. A program failure is indicated by a memory cell that cannot flip to a "0". This kind of failure is sector-based. Other sectors in the same segment may be functional.

In accordance with the described embodiment, defect management is at two levels: sector and segment. Taking sector-level defect management first, FIGS. 5A and 5B illustrate an example of a sector-level defect management table. In the FIG. 5A example, one byte is used for each SDM (i.e., to indicate sector-level defects in each segment). If a segment has less than 8 sectors as in the FIG. 5B example, each bit in an SDM byte represents one sector. If a segment has greater than 8 sectors, then each bit represents multiple sectors. For example, if a segment has 16 sectors, then each of the eight SDM bits represents two sectors. As discussed above, the SDM is stored in the SDM field 408 of one sector 400 of a segment. As is also discussed above, in one embodiment, the sector 400 in which the SDM for a segment is stored is the first non-defective sector of that segment.

Which sector is the first non-defective sector is determined from the SECTOR VALID portion of the CHECK-SUM field 412 of the sectors. FIG. 5A shows that the SDM field of the first sector (sector 0) in the eight-sector segment is good. That is, the sector valid field is FH. Then, the status (defect or not) of the remaining sectors can be determined from the SDM field of sector 0. Given the SDM field of DBh (1101 101 1b), it can be seen that sectors 0, 1, 3, 4, 6 and 7 are good; and sectors 2 and 5 are bad. FIG. 5B shows that the segment has 16 sectors, and each SDM bit represents 2 sectors. A bit in the SDM field for a two-sector pair is 1 only if both of the corresponding sectors are good. In other words, if one of these two sectors is bad, the corresponding bit will be 0. FIG. 5B shows that the first two sets of sectors (00 and 01; and 02 and 03) are bad. As a result, the SDM is recorded on sector 4 (the first sector for which the SECTOR VALID indication is fh).

An embodiment of sector-level defect management has been described. Now, an embodiment of segment-level defect management is described. A segment-level defect mapping table indicates whether particular segments (as opposed to sectors) are usable. Generally, segment failures have two manifestations: manufacture defect or erase failure. In accordance with an embodiment, manufacturing defects are recorded in a manufacture defect list (MDL), constructed at the first low-level format of the media 102 (usually at the first power up of the card 100). Typically, the MDL is fixed once it is built and is not modifiable (either by the hardware or by the controller 112 operating under control of the firmware stored in the EEPROM 114).

A hard defect table (HDT) is also maintained. The HDT originates from the MDL, and is a "working copy" for segment-level defect management. For any segment that the MDL indicates is defective, the HDT should have an indication that the defective segment is unusable. Furthermore, when a segment-level defect is newly found, the HDT is modified to include an indication that the defective segment is unusable. In addition, it is helpful to the integrity of the HDT if all of the sectors in the erase-failed segment are marked as being "discarded" before the HDT is modified. In this way, if a power failure occurs before writing to the HDT, the HDT may be rebuilt at the next power-up by using the MDL as a foundation.

In one embodiment, the MDL and HDT have an identical format—namely, a linear array of bits numbered from bit 0 to bit 7, where each bit in the MDL and HDT corresponds to one segment in the media 102. Specifically, for a segment SG, a bit corresponds to bit BT in byte BY of the MDL (or HDT), where:

BT=SG% 8

BY=SG/8.

If the bit is "1", the corresponding segment is good. If the bit is "0", then the corresponding segment is bad and should not be used. The MDL and HDT are stored in the EEPROM 114, but can also be stored on the media 102 (e.g., if the EEPROM 114 is not flash memory at all, but is ROM, or if space is limited in the EEPROM 114).

Figure 6:
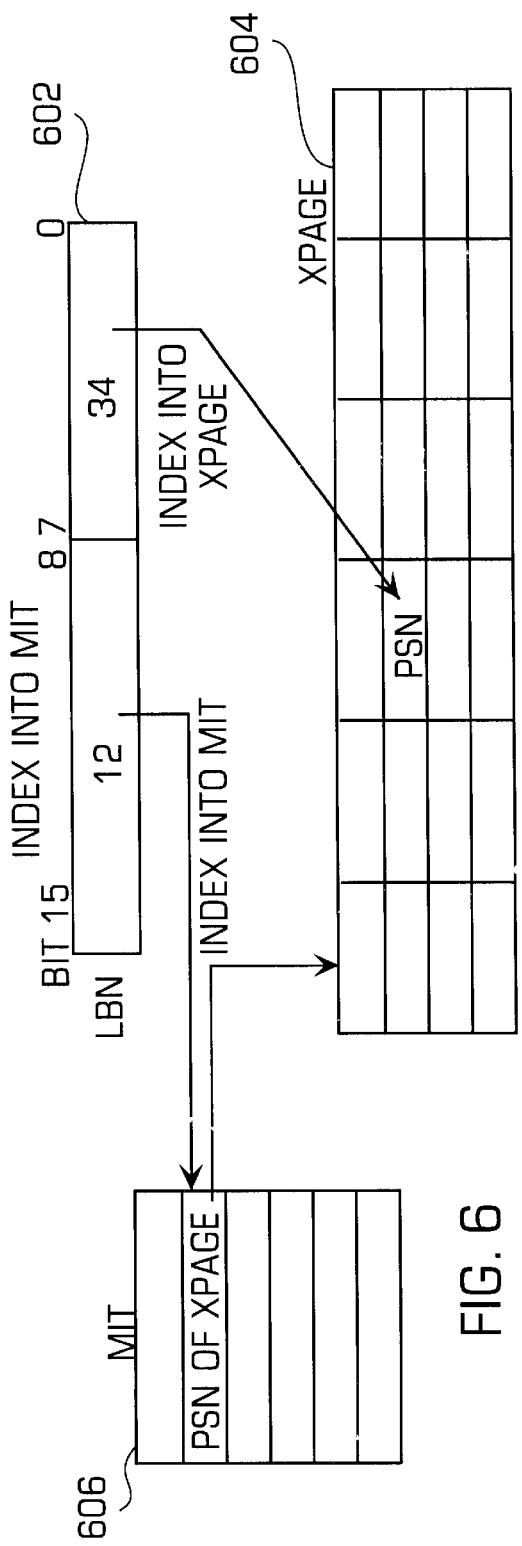
FIG. 6 illustrates a mapping mechanism to map logical block numbers (logical sectors) to physical sector numbers (PSN's) on the flash media.

A mapping mechanism, for mapping logical block numbers (LBN) of sectors accessed by the host to physical sector numbers (PSN) of the media. 102, is now discussed. With reference to FIG. 6, it is noted that, in one embodiment, a write operation to flash memory typically requires two sequential operations. First, an erase operation is required, in which the memory cells are charged to "1". Then, a program operation is required, in which memory cells are discharged to "0". A complication is that while the program operation can be carried out by page (e.g., sector), the erase operation can only be carried out by segment. Therefore, the required erase operation limits where a sector can be written. While the media 102 is programmed by page (i.e., sector), the erase function is carried out by segment. Thus, in the embodiment just discussed, while the host may access a sector by logical block number (LBN) from 0 to N (where N depends on the address space of the media 102) for writing, the required erase operation limits the actual phyical sector where that data can be written.

Thus, in one embodiment, a mapping mechanism is employed that maps logical block numbers (logical sectors) to PSN's on the physical media 102. An embodiment of this mapping mechanism is shown schematically in FIG. 6. First, XPAGE's (one is shown in FIG. 6, designated by reference numeral 604) are provided that, when indexed by logical sector, map that logical sector onto a particular physical sector on the media 102. Put another way, each XPAGE is an array of PSN entries. The number of entries per XPAGE is limited by the number of bits used for each PSN. In one embodiment, each XPAGE is 512 bytes.

When the host requests access to a LBN 602, a specific XPAGE is located via the Master Index Table (MIT) 606. In one embodiment, the upper 8 bits of the LBN 602 are used as an index into the MIT 606. The MIT is an array of PSN entries. The entry of the MIT 606 indexed by the upper 8 bits of the LBN is the PSN of the XPAGE that includes the PSN corresponding to the requested LBN 602. As an example, if one XPAGE holds XpageSize of entries, the index will be:

IndexToMIT=LBN/XpageSize.

If XpageSize=256, then IndexToMIT is LBN/256, which is the high byte of LBN. As discussed above, the entry of the MIT 606 is the PSN indicating where the XPAGE is physically located. The size of the MIT 606 depends on how many bits are required for the PSN on the address space of the media 102.

In one embodiment, the MIT 606 is stored in the local buffer 116. The contents of the local buffer 116, including the MIT 606, are lost when power is lost to the card 100. The MIT 606 can be reconstructed at power up by reading all XPAGE sectors. Preferably, the XPAGE sectors are easily found in order to speed up reconstruction of the MIT 606.

Now, the XPAGE 604 itself, in accordance with one embodiment, is described. As has already been discussed, the XPAGE 604 is a mapping table that indicates where on the media 102 a physical sector resides that corresponds to a requested logical sector. The number of entries in the XPAGE 604 depends on both the total size of the XPAGE and on the number of bits for each PSN. Within the XPAGE 604, the PSN is determined by an index to XPAGE. In one embodiment, if one XPAGE can hold XpageSize of entries, the index is:

IndexToXPAGE=LBN % XpageSize.

For example, if XpageSize is 256, IndexToZPAGE is LBN % 256, which is the low byte of LBN. Furthermore, the total number of XPAGES is the minimal integer greater than:

(Total Number of Physical Sectors)/XpageSize

XPAGE is recorded on the media 102. In one embodiment, two sectors are allocated in the local buffer 116 for caching XPAGE's.

For host read operations, XPAGE is used to locate the PSN of the requested LBN. In particular, from the LBN, the IndexToMIT is determined. From the MIT 606 (indexed by the determined IndexToMIT), the XPAGE 604 that holds the PSN is determined. If the XPAGE 604 is in the cache in the local buffer 116, the PSN is then determined from the XPAGE 604 using IndexToXPAGE. If the XPAGE 604 is not in the cache in the local buffer 116, then the XPAGE 604 is loaded from the media 102. If an XPAGE 604 in the cache in the local buffer 116 is updated, then the updated XPAGE 604 should be written to the media 102.

For host write operations, XPAGE 604 is updated to reflect the mapping change of the LBN to a new PSN. First, a previously-erased sector is found in which to store the to-be-written data. Then, the correct XPAGE is loaded into the cache in the local buffer 116. Then, the corresponding entry in XPAGE 604 is updated to reflect the mapping change. When a later operation needs space in the local buffer 116 cache (or, in some embodiments, after a certain time has elapsed), the updated entries in the XPAGE 604 in the cache in the local buffer 116 are written to the media 102.

Whenever a logical sector is remapped to a different physical location of the media 102 due to a defect of the physical sector, update of user data, transfer of data to another location for segment erasure, or for any other operation, the appropriate entry in the XPAGE 604 is updated to reflect the new physical sector location.

It is noted again that the MIT 606 is built during power-up based on the XPAGEs 604. In one embodiment, to accelerate this building, if a segment is used for XPAGE 604, all sectors in that segment are used for XPAGE 604. That is, as discussed briefly earlier in this specification, in this embodiment, the media 102 is divided up into XPAGE 604 segments and user data segments. Then, only the XPAGE 604 segments need be searched in building the MIT 606.

Figure 7:
FIGS. 7–9 illustrate tables used to track media usage, where
Figure 8:
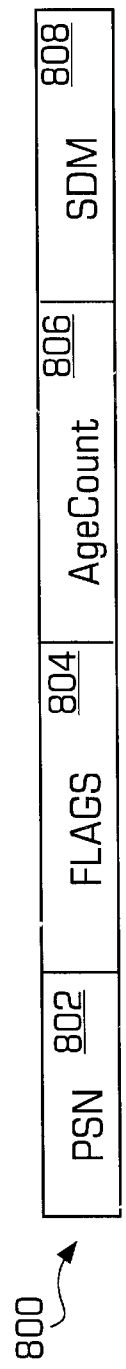
Figure 9:
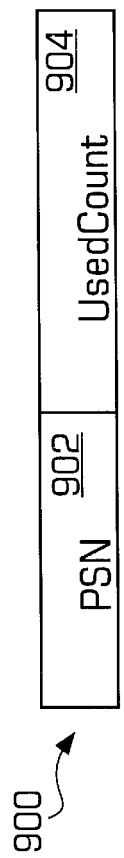

In addition to the MIT/XPAGE mapping mechanism discussed above, some embodiments employ other data structures to track the media usage. FIG. 7 illustrates a free list table 700; FIG. 8 illustrates an erasable and relaxation table 800; and FIG. 9 illustrates a transfer table 900.

The free list table 700 is used to store an indication of erased segments that are candidates to be used as either user data or XPAGE. Each entry has a PSN field 702, an AgeGroup field 704, and an SDM field 706. The table 700 is held in the local buffer 116. The PSN field 702 is an indication of the first sector of the free segment. The size depends on the size of the PSN. If the size of the segment is a power of two, the segment number may be stored in the PSN 702 field (with trailing zeros removed). The AgeGroup field 704 is part (or, in some embodiments, all) of AGE COUNT described earlier with reference to FIG. 4. Finally, the SDM field 706 is the segment defect map showing which sectors in the segment are bad. The segment defect map is described earlier with reference to FIG. 4.

AGE COUNT is counted from FFFFFFh down to 0h, as the new chip has all FFh in AGE COUNT, by default. The free list table 700 is organized in AgeGroup descending order: the segments with the highest AgeGroup value (i.e., youngest segments) are on the top of the free list table 700 and the segments with the lowest AgeGroup value (i.e., the oldest segments) are at the bottom of the free list table 700. When a segment is taken out of the free list table 700 to store data, the segment is taken from the top of the free list table 700. Thus, the free list table 700 indicates a collection of pre-erased segments (status of all sectors are FFh, indicating "erased") such that wear-levelling can be achieved throughout the media 102. Any operation that requires writing data to the media 102 can be performed by either the host or by the MCU 112 executing the firmware stored in the EEPROM 114. The MCU is, for example, an 8051 (available from Intel Corporation; located at 2200 Mission College Blvd. Santa Clara, Calif. 95052-8119 USA), 6805 (available from Motorola, Inc. located at 1303 E. Algonquin Rd., Schaumburg, Ill. 60196, USA) z80 (available from Zilog, Inc. located at 910 E. Hamilton Ave, Campbell, Calif. 95008), 6502 (available from Motorola, Inc.) or other microcontroller. The free list table 700 is maintained under the control of the MCU 112 executing the firmware stored in the EEPROM 114, which adds the indications. of pre-erased segments to the free list table 700. The firmware stored in the EEPROM 114 is such that, when there are no pre-erased segments left on the media, the MCU 112 tries to erase discarded segments, if any.

Referring now to FIG. 8, the erasable and relaxation table 800 holds an indication of a segment that is waiting to be erased. Referring to the earlier discussion with reference to FIG. 4, a segment is erasable if all sectors in the segment are marked with a status byte 414 (also called state byte) of 00h, 88h or FFh. "Relaxation" means that if a segment encounters an erase failure, the segment is allowed to reset for some period of time (e.g., two seconds) and then the erase operation is attempted again.

The PSN field 802 is similar to the PSN field 702 discussed above with reference to the free list table 700.

The flags field 804 is a three bit flag, the contents of which are controlled by the MCU 112 executing the firmware stored in the EEPROM 114, as discussed below. Bits 0 and 1 of the flags field 804, if 0h, each represent a relaxation already made. That is, at first, all of the bits of the flag field 804 are 1h. After the first relaxation, bit 0 goes to 0h. After the second relaxation, bit 1 goes to 0h. Bit 2 is used to indicate a relaxation timeout. Whenever a segment enters relaxation, bit 2 is cleared to 0h and a relaxation timer (not shown) is started. Upon timeout of the relaxation timer, bit 2 is reset to 1h. In one implementation, the three bits of the flags field 804 are "borrowed" from the highest three bits of the AgeCount field 806, which makes AgeCount 21 bits (i.e., 2,097,152, much more than the typical endurance cycle of approximately 1,000,000).

The SDM field 808 is similar to the SDM field 706 of the free list table 700.

The erasable and relaxation table 800 is organized such that relaxation entries are at one end of the table 800 (e.g., the bottom) and erasable entries are at the top end of the table 800 (e.g., the top). In one embodiment, AgeCount is counted from 1FFFFEh down to 0, and all erasable entries are organized in the table 800 in AgeCount descending order, with the segments having the highest AgeCount (youngest) on the top of the table 800 and the segments having the lowest AgeCount (oldest) at the bottom of the table 800. When segments are taken off the table 800 to be erased, the segments are taken from the top of the table 800. This ensures that the youngest segments are erased first, and relaxation segments will not be erased again if there are other erasable segments available. That is, relaxation will be as long as possible.

Referring to FIG. 9, a transfer table 900 is shown that is usable to merge usable sectors of partially discarded sectors together to make some "fully discarded" sectors available. The PSN field 902 points to the first sector of a segment, where the size of the PSN field 902 depends on the size of PSN in the system 100. The UsedCount field 904 indicates the number of sectors that have usable data. In one embodiment, the PSN field 902 is 12 bits and the UsedCount field 904 is 4 bits. The size of the transfer table 900 depends, at least in part, on the amount of available space in the local buffer 116.

In the transfer table 900, records for segments are stored in increasing order. When transfer (i.e., merging) is needed, it is preferable that the firmware stored in the EEPROM 114 is such that the MCU 112 merges the sectors of two or more segments with the least usable data. If the transfer table 900 is full, segments with fewer usable sectors are loaded into the table 900 to replace those segments with more usable sectors.

It should be understood that various alternatives to the embodiments of the invention described herein may be employed in practicing the invention. For example, many of the fields have been described to have a particular number of bits, but should not be construed to be so limited. As another example, many if not all of the functions described as being performed by a microcontroller under the control of firmware may also be performed under the control of hardwired circuitry, or even under the control of application specific integrated circuits (ASICs). It is intended that the following claims define the scope of the invention and that methods and apparatus within the scope of these claims and their equivalents be covered thereby.

What is claimed is:

1. A method of writing new data to replace old data in a location defined by a logical block number, in an electrically-erasable media having a plurality of physical sectors, each having a plurality of non-volatile memory cells, with each physical sector having a location defined by an associated physical sector number, with said new data replacing said old data from a first physical sector number, said method comprising:

determining from a master index table, a second physical sector number, different from said first physical sector number, corresponding to said logical block number, the second physical sector containing a table of other physical sector numbers including said first physical sector number;

replacing said first physical sector number in said second physical sector by a third physical sector number, said third physical sector number different from said first physical sector number and different from said second physical sector number; the third physical sector containing erased memory cells;

writing said new data to said erased memory cells of said third physical sector;

marking the first physical sector as being ready for erasure; and erasing substantially simultaneously a plurality of physical sectors, including said first physical sector, each of which has been marked as being ready for erasure.

2. The method of claim 1 further comprising:

building the master index table, including;

inspecting a status portion of each physical sector to determine whether a physical sector contains a table of physical sector numbers;

including a physical sector number of a physical sector in the master index table in the event of an affirmative determination.

3. The method of claim 1 wherein the step of determining the second physical sector number includes accessing the contents of said second physical sector number.

4. The method of claim 3, wherein the step of accessing the contents of said second physical sector number includes:

determining whether a coherent copy of said table of other physical sector numbers including said first physical sector number is in a cache; and if it is determined that a coherent copy of said table of other physical sector numbers including said first physical sector number is in a cache, accessing said table from the cache, and otherwise, accessing the contents of said second physical sector from the electrically-erasable media.

5. A memory system for use by a host processor, comprising:

an electrically erasable memory having a plurality of physical sectors, each having a plurality of non-volatile memory cells, said memory cells required to be erased before being written, with each physical sector having a location defined by an associated physical sector number; and a control circuit for receiving data to be written into a location defined by said logical block number, said control circuit for mapping said logical block number to a first physical sector number with the mapping stored in a table of physical sector numbers in a second physical sector of said electrically erasable memory, and for erasing substantially simultaneously a plurality of physical sectors from said electrically erasable memory marked for erasure, wherein said control circuit comprises:

a buffer; and a microcontroller for retrieving said table of physical sector numbers from said second physical sector of said electrically erasable memory and storing said table in said buffer;

wherein each physical sector of said electrically erasable memory has a status field associated therewith for indicating whether the physical sector has valid data stored therein, has data to be erased, is erased, or contains a table of physical sector numbers for mapping purposes.

6. The memory system of claim 5, wherein the control circuit selects the first physical sector having a status field indicating the sector is erased for storing data to be written into a location defined by said logical block number.

7. The memory system of claim 6, wherein in the event said data to be written into said location defined by the host processor is for replacing data at said location, said control circuit further marks the status field of a physical sector having the data to be replaced as having data to be erased.

8. An interface system to access a physical sector on an electrically erasable memory based on a logical block number, said electrically erasable memory having a plurality of physical sectors, each having a plurality of non-volatile memory cells, said memory cells required to be erased before being written, with each physical sector having a location defined by an associated physical sector number said interface system comprising:

a buffer for storing a table mapping a plurality of logical block numbers to a plurality of first physical sector numbers, and a control circuit for receiving data to be written into said logical block number, said control circuit for mapping said logical block number to a first physical sector number based upon said table, and to erase substantially simultaneously a plurality of physical sectors from said electrically erasable memory marked for erasure;

wherein each physical sector of said electrically erasable memory has a status field associated therewith for indicating whether the physical sector has valid data stored therein, has data to be erased, is erased, or contains a table of physical sector numbers for mapping purpose.

9. The interface system of claim 8 wherein the control circuit selects the first physical sector having a status field indicating the sector is erased for storing data to be written into a location defined by said logical block number.

10. The interface system of claim 9, wherein in the event said data to be written into said location defined by said logical block number is for replacing data at said location, said control circuit further marks the status field of a physical sector having the data to be replaced as having data to be erased.

\* \* \* \* \*